(12) United States Patent
Szopko et al.

(10) Patent No.: US 8,374,282 B2
(45) Date of Patent: Feb. 12, 2013

(54) METHOD AND APPARATUS FOR IMPROVING DIGITAL PREDISTORTION CORRECTION WITH AMPLIFIER DEVICE BIASING

(75) Inventors: Robert S. Szopko, Downers Grove, IL (US); Mark B. Anderson, Crystal Lake, IL (US); Scott A. Niemiec, Belvidere, IL (US)

(73) Assignee: Motorola Mobility LLC, Libertyville, IL (US)

( * ) Notice: Subject to any disclaimer, the term of this patent is extended or adjusted under 35 U.S.C. 154(b) by 733 days.

(21) Appl. No.: 12/179,035

(22) Filed: Jul. 24, 2008

(65) Prior Publication Data

US 2010/0020899 A1    Jan. 28, 2010

(51) Int. Cl.
*H04L 25/49* (2006.01)
(52) U.S. Cl. ......... 375/297; 375/296; 375/295; 375/289
(58) Field of Classification Search .................. 375/296, 375/297, 289, 295
See application file for complete search history.

(56) References Cited

U.S. PATENT DOCUMENTS

| | | | | |
|---|---|---|---|---|
| 3,733,558 A | * | 5/1973 | Cramer et al. | 330/259 |
| 3,755,754 A | * | 8/1973 | Putz | 330/149 |
| 6,097,252 A | * | 8/2000 | Sigmon et al. | 330/136 |
| 6,288,606 B1 | | 9/2001 | Ekman et al. | |
| 7,095,282 B2 | * | 8/2006 | Barabash | 330/289 |
| 7,109,792 B2 | | 9/2006 | Leffel | |
| 7,761,065 B2 | * | 7/2010 | Drogi et al. | 455/126 |
| 2003/0092462 A1 | * | 5/2003 | Dartois | 455/522 |
| 2003/0107434 A1 | * | 6/2003 | Mitzlaff | 330/149 |
| 2004/0061555 A1 | * | 4/2004 | Lynch | 330/136 |
| 2005/0057303 A1 | * | 3/2005 | Leffel | 330/75 |
| 2006/0091949 A1 | * | 5/2006 | Smithson | 330/149 |
| 2006/0108660 A1 | * | 5/2006 | Ui | 257/491 |
| 2006/0229036 A1 | * | 10/2006 | Muller et al. | 455/114.3 |
| 2006/0238245 A1 | * | 10/2006 | Carichner et al. | 330/136 |
| 2007/0010215 A1 | * | 1/2007 | Porco et al. | 455/114.3 |
| 2008/0008263 A1 | * | 1/2008 | Keerthi et al. | 375/297 |
| 2008/0211583 A1 | * | 9/2008 | Nguyen et al. | 330/297 |
| 2009/0149151 A1 | * | 6/2009 | Bryant | 455/341 |

FOREIGN PATENT DOCUMENTS

WO    2006019606 A2    2/2006

OTHER PUBLICATIONS

Kim, Jung Hun: "The International Search Report and the Written Opinion of the International Searching Authority", Korean Intellectual Property Office, Daejeon, Republic of Korea, Completed: Feb. 2, 2010, Mailed: Feb. 2, 2010, all pages.

* cited by examiner

*Primary Examiner* — Kenneth Lam

(57) ABSTRACT

A method, apparatus, and electronic device for using digital predistortion are disclosed. A transmitter 212 may transmits a transmission signal. A receiver 214 may monitor the transmission signal to execute digital predistortion of the transmission signal to compensate for distortion. A field programmable gate array or application specific integrated circuit 226 may adjust a power amplifier bias to improve the digital predistortion.

15 Claims, 3 Drawing Sheets

METHOD AND APPARATUS FOR IMPROVING DIGITAL PREDISTORTION CORRECTION WITH AMPLIFIER DEVICE BIASING

FIELD OF THE INVENTION

The present invention relates to a method and system for applying digital predistortion to a signal. The present invention further relates to biasing an amplifier to improve the distortion of a signal.

INTRODUCTION

High speed wireless internet access systems such as WIMAX® may have high peak-to-average signals, creating a need in access point transmitters for high linearity. A transmitter may achieve this high linearity by employing some type of adaptive linearization scheme, such as digital predistortion (DPD). Applying DPD to a WiMAX® or other time division duplexing system may involve the use of an observation receiver during the transmit portion of the burst to monitor the signal. The monitored transmitter signal may be compared to the original transmitter signal and the next transmitted signal may be adjusted appropriately to account for distortion caused by power amplifiers in the transmitter circuit.

In time division duplexing (TDD) orthogonal frequency-division multiple access (OFDMA) systems, feed forward amplifier design may not be optimal due to component count, cost, and complexity. Using DPD within a field programmable gate array (FPGA) or application-specific integrated circuit (ASIC) may be a better option for these systems. The method and complexity of DPD algorithms may vary widely but have the same purpose, to correct distortion generated by non-linear power amplifiers. The correction algorithm may manipulate the baseband signal in order to compensate for distortions by sampling some of the transmitted signal. As the power amplifier changes based on the signal and environment, the DPD algorithm may change compensation. In some cases, the amplifier may become less correctable due to distortions that change based on the above mentioned conditions.

SUMMARY OF THE INVENTION

A method, apparatus, and electronic device for using digital predistortion are disclosed. A transmitter may transmit a transmission signal. A receiver may monitor the transmission signal to enable digital predistortion of the transmission signal to compensate for distortion. A field programmable gate array or application specific integrated circuit may adjust a power amplifier bias to improve performance with digital predistortion.

BRIEF DESCRIPTION OF THE DRAWINGS

Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Additional features and advantages of the invention will be set forth in the description which follows, and in part will be obvious from the description, or may be learned by practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth herein.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

The present invention comprises a variety of embodiments, such as a method, an apparatus, and an electronic device, and other embodiments that relate to the basic concepts of the invention. The electronic device may be any manner of computer, mobile device, or wireless communication device.

A method, apparatus, and electronic device that may manipulate the biasing of a laterally diffused metal-oxide semiconductor (LDMOS) device for improved correction capability in a time division duplex (TDD) orthogonal frequency division multiple access (OFDMA) system using a look up table (LUT) based digital predistortion (DPD). A transmitter may transmit a transmission signal. A receiver may monitor the transmission signal to execute digital predistortion of the transmission signal to compensate for distortion. A field programmable gate array or application specific integrated circuit may adjust a power amplifier bias to improve the performance with digital predistortion.

Figure 1:
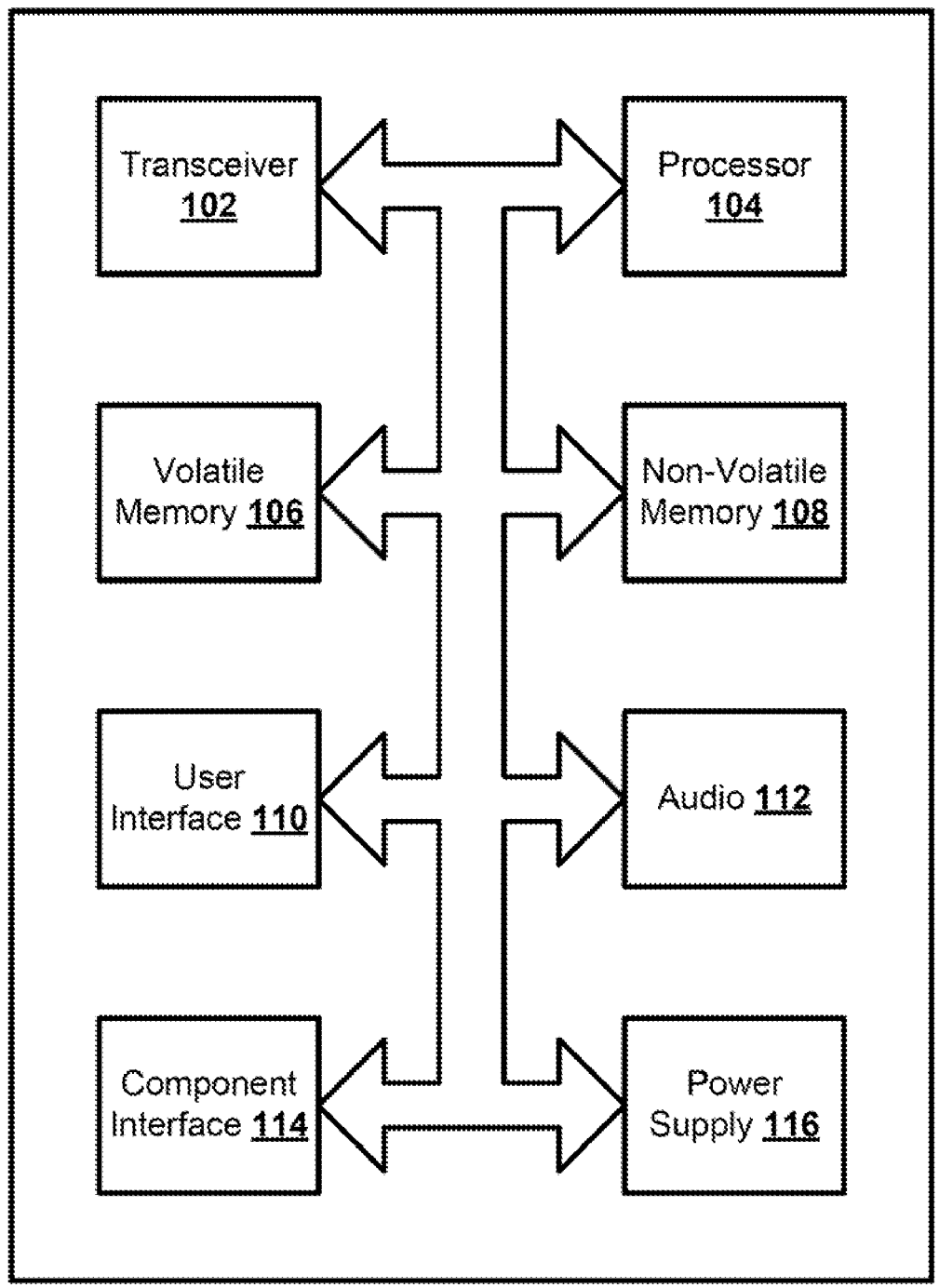
FIG. 1 illustrates in a block diagram one embodiment of a computing device that may implement digital predistortion on a data transmission.

FIG. 1 illustrates in a block diagram one embodiment of a computing device 100 that may implement digital predistortion on a data transmission. Any computing device, such as a desktop computer, handheld device, or a server, may implement this high-speed data signal transceiver. The computing device 100 may access the information or data stored in a network. The computing device 100 may support one or more applications for performing various communications with the network. The computing device 100 may implement any operating system, such as Windows or UNIX, for example. Client and server software may be written in any programming language, such as C, C++, Java or Visual Basic, for example. The computing device 100 may be a mobile phone, a laptop, a base station, a wireless access point, a personal digital assistant (PDA), or other portable device. For some embodiments of the present invention, the computing device 100 may be a WiFi capable device, which may be used to access the network for data or voice by using voice over internet protocol (VOIP). The computing device 100 may include a network interface 102, such as a transceiver, to send and receive data over the network.

The computing device 100 may include a controller or processor 104 that executes stored programs. The controller or processor 104 may be any programmed processor known to one of skill in the art. However, the decision support method may also be implemented on a general-purpose or a special purpose computer, a programmed microprocessor or microcontroller, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, any device or devices capable of implementing the decision support method as described herein can be used to implement the decision support system functions of this invention.

The computing device 100 may also include a volatile memory 106 and a non-volatile memory 108 to be used by the processor 104. The volatile 106 and nonvolatile data storage 108 may include one or more electrical, magnetic or optical memories such as a random access memory (RAM), cache, hard drive, or other memory device. The memory may have a cache to speed access to specific data. The memory may also be connected to a compact disc—read only memory (CD-ROM), digital video disc—read only memory (DVD-ROM), DVD read write input, tape drive or other removable memory device that allows media content to be directly uploaded into the system.

The computing device 100 may include a user input interface 110 that may comprise elements such as a keypad, display, touch screen, or any other device that accepts input. The computing device 100 may also include a user output device that may comprise a display screen and an audio interface 112 that may comprise elements such as a microphone, earphone, and speaker. The computing device 100 also may include a component interface 114 to which additional elements may be attached, for example, a universal serial bus (USB) interface or an audio-video capture mechanism. Finally, the computing device 100 may include a power supply 116.

Client software and databases may be accessed by the controller or processor 104 from the memory, and may include, for example, database applications, word processing applications, video processing applications as well as components that embody the decision support functionality of the present invention. The user access data may be stored in either a database accessible through a database interface or in the memory. The computing device 100 may implement any operating system, such as Windows or UNIX, for example. Client and server software may be written in any programming language, such as C, C++, Java or Visual Basic, for example.

Figure 2:
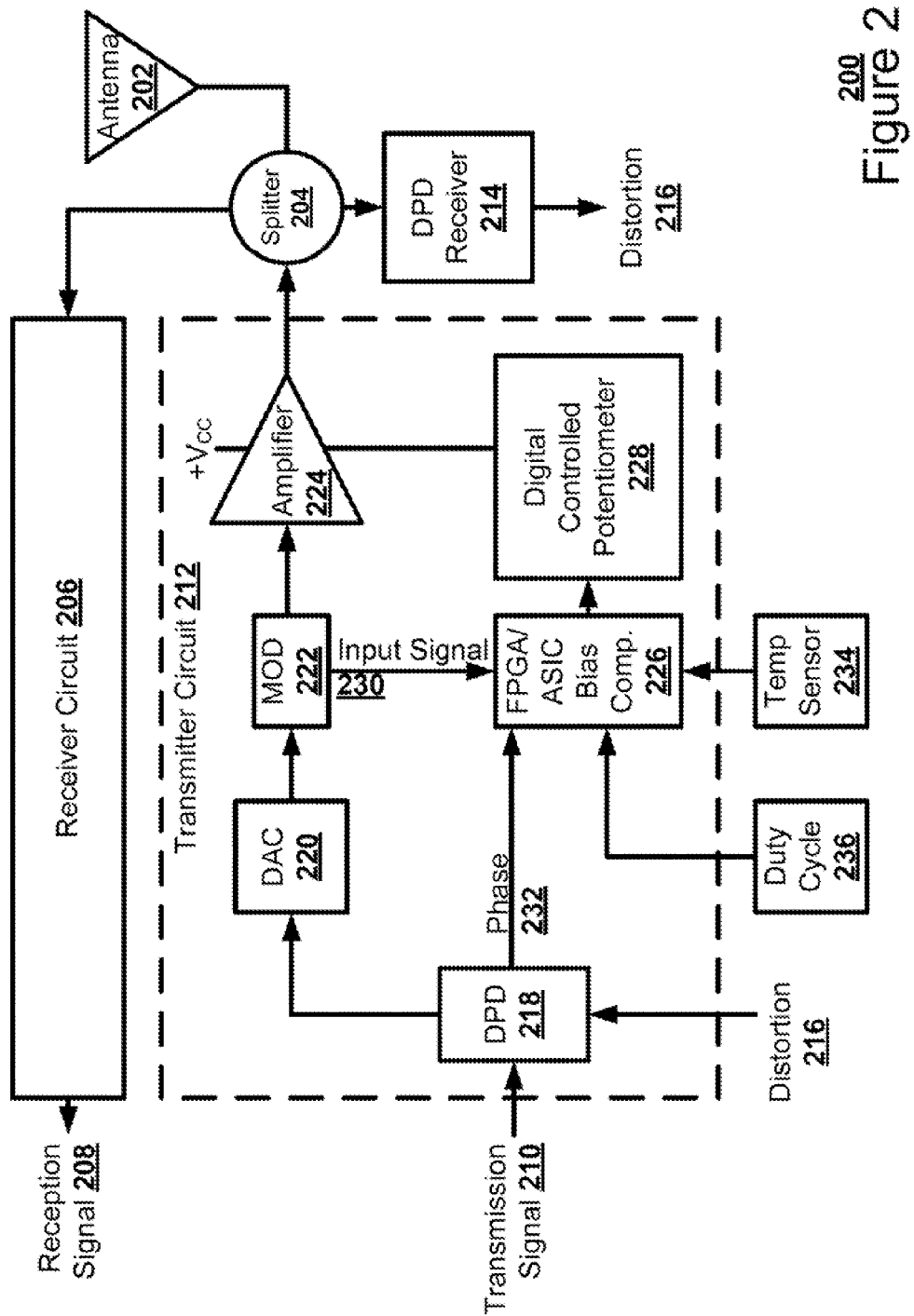
FIG. 2 illustrates in a block diagram one embodiment of a simplified transceiver executing digital predistortion.

The transceiver 102 may improve the fidelity of a transmission signal using an adaptive linearization scheme, such as DPD. In DPD, a signal may be predistorted before being sent through the transmitter circuit in a way that distortions of the transmitter circuit result in a corrected signal. FIG. 2 illustrates in a block diagram one embodiment of a simplified transceiver 102 executing an exemplary method of DPD. The transceiver 102 may receive a signal on an antenna array 202, which may be passed through a splitter 204 to a receiver circuit 206. The receiver circuit 206 may demodulate and amplify the reception signal 208 before passing the reception signal 208 on to be translated, presented, or stored. The processor 104 may send a transmission signal 210 to a transmitter circuit to be modulated and amplified before being sent to the AA 202 via the splitter 204. The amount of distortion to the transmission signal 210 created by the transmitter circuit 212, by the power amplifiers or other circuit components, may be measured and observed by the receiver circuit 206 or a separate DPD receiver circuit 214. The distortion observation 216 may be fed back into the transmitter circuit 212, so that the transmission signal 210 may be predistorted to eliminate distortion caused by the transmitter circuit 212.

The transmitter circuit 212 may use a DPD logic block 218 to create a predistorted signal. The DPD logic block 218 may monitor the input signal to the transmitter circuit 212 and compare that signal to the output of the transmitter circuit 212. The DPD logic block may process and generate a predistorted signal based on that comparison to be applied to a digital to analog converter (DAC) 220. The DAC 220 may convert the predistorted transmission signal 210 from a digital signal to an analog signal. A modulator (MOD) 222 may modulate the transmission signal 210 for transmission. A power amplifier 224 may amplify the power of the transmission signal 210 for transmission.

A TDD system may use a transmitter/receiver switch or may bias off the LDMOS devices, such as an amplifier 224, during the receive portion of the burst, in order to not degrade receiver circuit 206 sensitivity. Biasing off the device may create variations in the gate voltage and thus the quiescent bias point, which determines the amplifier operating state. The change in bias may be adjusted based on a variety of environmental factors in order to improve device performance.

A field programmable gate array (FPGA) or an application specific integrated circuit (ASIC) 226 may use a DAC or a digital controlled potentiometer 228 to control the bias of the power amplifier 224 by adjusting the gate voltage. The FPGA/ASIC bias compensator (bias comp) 226 may calculate the proper bias using many factors from a multitude of sources, such as the input signal 230 to the amplifier 226, phase 232 from the DPD logic block 218, a temperature reading from a temperature sensor 234, a distortion observation 216, duty cycle 234, or other data factors.

Figure 3:
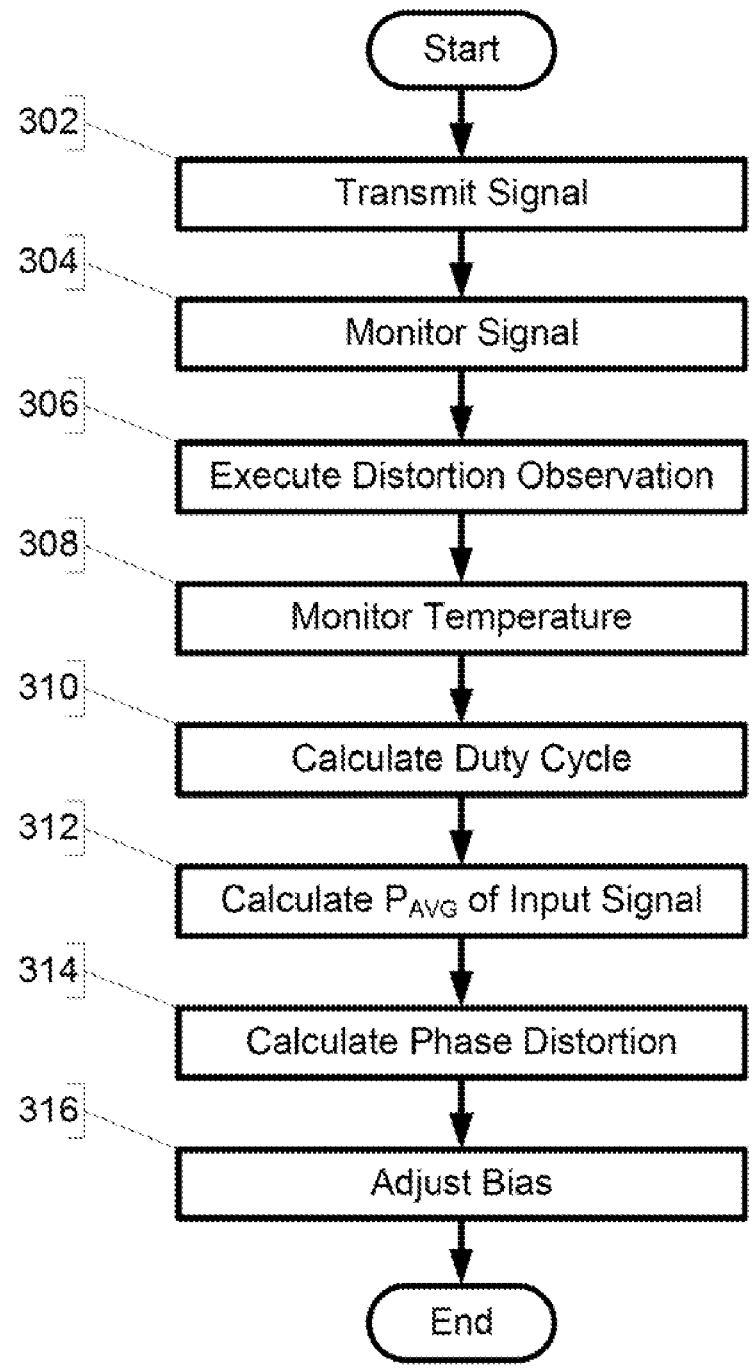
FIG. 3 illustrates in a flowchart one embodiment of a method for adjusting bias during digital predistortion.

FIG. 3 illustrates in a flowchart one embodiment of a method 300 for adjusting bias during digital predistortion. The TX circuit 212 may transmit a signal (Block 302). The FPGA/ASIC 226 may monitor the signal as it is being transmitted into the amplifier 224 (Block 304). The DPD receiver circuit 214 may execute a distortion observation 216 (Block 306). Note, the receiver circuit 206 may be used in place of the DPD receiver circuit 214.

A temperature sensor 234 may monitor temperature of the amplifier 226 (Block 308). As the amplifier is varied over temperature, the bias point may drift. The FPGA/ASIC 226 may change the bias to optimize pre-distortion performance. In the case of a Wimax® system using a LUT-based DPD, the performance of a part outside of the loop may be discounted, concentrating on the depths the device may be corrected.

To correctly adjust the biasing of the device over temperature, a significant amount of characterization data may be captured on the part's performance while applying DPD. The FPGA/ASIC 226 may let the bias drift from 0-50 C, and then at the temperature edges, may apply a linear compensation based on the temperature. Since each device may be unique in its characteristics, a sample evaluation may be conducted. By using either a piece-wise linear compensation, or a more complex polynomial compensation, the FPGA/ASIC 226 may optimize DPD correction and overall performance to compensate for changes in the device characteristics over temperature.

The FPGA/ASIC 226 may calculate the duty cycle 236 by determining the percentage of transmission time as a factor of the total time (Block 310). Since a frame may be short, such as 5 milliseconds in the case of the default Wimax® configuration, the proper bias point may not be reached during a transmit portion of the duty cycled signal. The changes in duty cycle 236 may result in a mean shift between TDD and continuous, and a variation over the cycle when in TDD mode. The device design based on thermal drift as well as setting of the voltage on the gate may be accounted for in the hardware design. The mean difference may be adjusted for in order to have the amplifier operating in the correct bias state.

The FPGA/ASIC 226 may have bias settings for a range of duty cycles. The range may be determined by the variation. For example, the FPGA/ASIC 226 may use the same bias set point from 20-30% duty cycle.

The FPGA/ASIC 226 may use the input signal 230 to the amplifier 224 to calculate the drive level (Block 312). In a Wimax® TDD system, the modulated signal may vary significantly while the average output power of the system may be fairly constant. Since the Federal Communication Commission (FCC) and many of the European Telecommunication Standards Institute (ETSI) emissions requirements for Wimax are defined as absolute levels, the correction required by the FPGA/ASIC 226 may vary based on the power level required from the system. When the transmitter circuit 212 is operated at lower power, the FPGA/ASIC 226 may reduce the bias on the power amplifier device to lower current consumption and thus improve efficiency.

The FPGA/ASIC 226 may use the DPD logic block 218 to calculate the phase change 232 relative to the input signal (Block 314). When using an amplifier in a closed loop DPD system, the receiver circuit 206 may capture and process the distorted signal. This process may down-convert the signal and may look at the magnitude and phase change relative to the input signal. As the amplifier changes over temperature, the phase distortion may also change. By measuring and recording the phase of the amplifier at room temperature, the FPGA/ASIC 226 may generate a baseline for phase distortion with DPD correction. As the amplifier varies over temperature, the FPGA/ASIC 226 may compare the phase change to the baseline phase, and may adjust the bias of the device to maintain a constant phase over temperature.

The FPGA/ASIC 226 may adjust the bias based upon these various observations and calculations (Block 316). Each of these factors may have different weighting in determining the effect the factors have in biasing power amplifier devices. The FPGA/ASIC 226 may start with the standard bias, then adjust based upon the duty cycle, temperature compensation, drive compensation, the phase compensations, and other considerations.

Embodiments within the scope of the present invention may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Embodiments may also be practiced in distributed computing environments where tasks are performed by local and remote processing devices that are linked (either by hardwired links, wireless links, or by a combination thereof) through a communications network.

Although the above description may contain specific details, they should not be construed as limiting the claims in any way. Other configurations of the described embodiments of the invention are part of the scope of this invention. For example, the principles of the invention may be applied to each individual user where each user may individually deploy such a system. This enables each user to utilize the benefits of the invention even if any one of the large number of possible applications do not need the functionality described herein. In other words, there may be multiple instances of the electronic devices each processing the content in various possible ways. It does not necessarily need to be one system used by all end users. Accordingly, the appended claims and their legal equivalents should only define the invention, rather than any specific examples given.

We claim:

1. A method for using digital predistortion in a transmitting circuit, comprising:
   monitoring, by a receiver, a transmission signal for distortion;
   generating, by the receiver, a distortion observation of the transmission signal in response to monitoring the transmission signal;
   receiving, by a digital predistortion block, an input signal and the distortion observation;
   executing, by the digital predistortion block, digital predistortion of the transmission signal to account for distortion, wherein the executing comprises comparing the input signal with the distortion observation by calculating a change in phase distortion of the transmission signal relative to the input signal; and
   adjusting a power amplifier bias in response to calculating the change in phase distortion of the transmission signal relative to the input signal to improve the digital predistortion.

2. The method of claim 1, further comprising:
   adjusting the power amplifier bias by adjusting the gate voltage.

3. The method of claim 1, further comprising:
   adjusting the power amplifier bias based on temperature.

4. The method of claim 1, further comprising:
   adjusting the power amplifier bias based on drive level.

5. The method of claim 1, further comprising:
   using at least one of a field programmable gate array or an application specific integrated circuit.

6. A telecommunications apparatus for using digital predistortion, comprising:
   a transmitter that transmits a transmission signal;
   a receiver that monitors the transmission signal, wherein the receiver generates a distortion observation of the transmission signal in response to monitoring the transmission signal;
   a digital predistortion block that receives the digital predistortion observation and the transmission signal and executes digitally predistortion of the transmission signal to compensate for distortion, wherein the executing comprises comparing the input signal with the distortion observation by calculating a change in phase distortion of the transmission signal relative to the input signal; and a field programmable gate array that adjusts a power amplifier bias in response to calculating the change in phase distortion of the transmission signal relative to the input signal to improve the digital predistortion.

7. The telecommunications apparatus of claim 6, wherein the field programmable gate array adjusts the power amplifier bias by adjusting the gate voltage.

8. The telecommunications apparatus of claim 6, wherein the field programmable gate array adjusts the power amplifier bias based on temperature.

9. The telecommunications apparatus of claim 6, wherein the field programmable gate array adjusts the power amplifier bias based on drive level.

10. The telecommunications apparatus of claim 6, wherein the field programmable gate array adjusts the power amplifier bias via a digital controlled potentiometer.

11. An electronic device for using digital predistortion, comprising:

a transmitter that transmits a transmission signal;

a receiver that monitors the transmission signal, wherein the receiver generates a distortion observation of the transmission signal in response to monitoring the transmission signal;

a digital predistortion block that receives the digital predistortion observation and the transmission signal and executes digitally predistortion of the transmission signal to compensate for distortion, wherein the executing comprises comparing the input signal with the distortion observation by calculating a change in phase distortion of the transmission signal relative to the input signal; and an application specific integrated circuit that adjusts a power amplifier bias in response to calculating the change in phase distortion to improve the digital predistortion.

12. The electronic device of claim 11, wherein the application specific integrated circuit adjusts the power amplifier bias by adjusting the gate voltage.

13. The electronic device of claim 11, wherein the application specific integrated circuit adjusts the power amplifier bias based on duty cycle.

14. The electronic device of claim 11, wherein the application specific integrated circuit adjusts the power amplifier bias based on temperature.

15. The electronic device of claim 11, wherein the application specific integrated circuit adjusts the power amplifier bias based on drive level.

* * * * *